(12) United States Patent
German (10) Patent No.: US 7,850,828 B2
(45) Date of Patent: Dec. 14, 2010

(54) ENHANCED VIRTUAL ANODE (75) Inventor: John German, Prairie Du Sac, WI (US)

(73) Assignee: Cardinal CG Company, Eden Prairie, MN (US)

( * ) Notice: Subject to any disclaimer, the term of this patent is extended or adjusted under 35 U.S.C. 154(b) by 1094 days.

(21) Appl. No.: 11/532,371

(22) Filed: Sep. 15, 2006

(65) Prior Publication Data

US 2008/0067057 A1    Mar. 20, 2008

(51) Int. Cl.
C23C 14/35 (2006.01)
(52) U.S. Cl. .............................. 204/192.12; 204/298.07; 204/298.14
(58) Field of Classification Search ............. 204/192.12, 204/298.07, 298.14
See application file for complete search history.

(56) References Cited

U.S. PATENT DOCUMENTS

| 3,830,721 | A | 8/1974 | Gruen |
| 4,166,018 | A | 8/1979 | Chapin |
| 4,802,968 | A | 2/1989 | Hendrix |
| 4,849,087 | A | 7/1989 | Meyer |
| 4,946,576 | A | 8/1990 | Dietrich |
| 5,039,376 | A | 8/1991 | Zukotynski |
| 5,108,574 | A | 4/1992 | Kirs |
| 5,223,111 | A | 6/1993 | Lueft |
| 5,322,605 | A | 6/1994 | Yamanishi |
| 5,334,302 | A | 8/1994 | Kubo |
| 5,384,021 | A | 1/1995 | Thwaites |
| 5,403,458 | A | 4/1995 | Hartig |
| 5,616,225 | A | 4/1997 | Sieck |
| 5,622,606 | A | 4/1997 | Kugler |
| 5,662,784 | A | 9/1997 | Schuhmacher |
| 5,733,418 | A | 3/1998 | Hershcovitch |

(Continued)

FOREIGN PATENT DOCUMENTS

DE    4412541 A1    10/1994

(Continued)

OTHER PUBLICATIONS

McClenahan et al., "Production of Thin Film by Controlled Deposition of Sputtered Materials" Topics in Applied Physics 64, pp. 338-377, 1991.

(Continued)

Primary Examiner—Rodney G McDonald
(74) Attorney, Agent, or Firm—Fredrikson & Byron, P.A.

(57) ABSTRACT

The apparatus and method involve using a gas manifold for introducing gas into a deposition chamber. Certain embodiments involve using a binary manifold for uniform distribution of the gas with good response time. During sputtering operations, provision of an anode using the gas manifold enables such anode to be entirely protected from sputtered dielectric material during the deposition process. As such, conduction paths are initially established and maintained between electrons within the chamber and the anode. This results in improved maintenance of stable plasma and consistent coating in the deposition chamber. The conduction paths are enhanced in comparison to conventional systems due to increased collisions between the electrons and gas flowing out of the manifold outlets. Also, ionization of the gas flowing from the manifold outlets is enhanced, resulting in enhanced deposition output from the system. A magnet can also be located within the manifold so as to further increase collisions between the electrons and gas flowing out of the manifold outputs.

51 Claims, 9 Drawing Sheets

U.S. PATENT DOCUMENTS

| | | |
|---|---|---|
| 5,747,362 A | 5/1998 | Visser |
| 5,855,745 A | 1/1999 | Manley |
| 5,897,753 A | 4/1999 | Schatz |
| 6,116,185 A * | 9/2000 | Rietzel et al. ........... 118/723 R |
| 6,153,067 A | 11/2000 | Maishev |
| 6,238,526 B1 * | 5/2001 | Maishev et al. ........ 204/192.11 |
| 6,246,059 B1 | 6/2001 | Maishev |
| 6,446,572 B1 | 9/2002 | Brcka |
| 6,458,253 B2 | 10/2002 | Ando |
| 6,495,000 B1 | 12/2002 | Atkinson |
| 6,504,294 B1 | 1/2003 | Mahoney |
| 6,710,524 B2 | 3/2004 | Gibson |
| 6,819,053 B2 | 11/2004 | Johnson |
| 6,988,463 B2 | 1/2006 | Veerasamy |
| 7,166,199 B2 | 1/2007 | Hartig |
| 2004/0118678 A1 | 6/2004 | Hartig |
| 2005/0103620 A1 | 5/2005 | Chistyakov |
| 2005/0211544 A1 * | 9/2005 | Reiter ..................... 204/192.2 |

FOREIGN PATENT DOCUMENTS

| | | |
|---|---|---|
| EP | 0413291 | 2/1991 |
| EP | 0674337 | 9/1995 |
| GB | 2145741 A1 | 4/1985 |
| WO | WO 99/65057 | 12/1999 |

OTHER PUBLICATIONS

Blondeel et al., "Controlled Reactive Sputter Deposition in DC Mode: an Alternative for Switching", Society of Vacuum Coaters, 2002, pp. 23-26.

Milde et al., "Gas Inlet Systems for Large Area Linear Magnetron Sputtering Sources", Society of Vacuum Coaters, 2001, pp. 205-209.

* cited by examiner

ENHANCED VIRTUAL ANODE

FIELD OF THE INVENTION

The present invention relates to apparatus and methods used for controlled sputter deposition of thin films on substrates in a coating chamber. More specifically, the present invention relates to apparatus and methods of using a gas distribution system in providing an anode for the controlled deposition.

BACKGROUND OF THE INVENTION

In the coated glass industry it is desirable to apply one or more thin layers of coating materials to one or both surfaces of glass sheets to provide desired characteristics to the finished coated glass product. For example, it is often desirable to apply infrared-reflective coatings and/or other multilayer coating systems to provide desirable characteristics related to transmittance, emissivity, reflectance, durability, color, photocatalysis and/or chemical resistance.

It can be argued that sputter deposition is frequently the most effective method of forming thin films on substrates. Compared with other thin-film formation methods such as vacuum evaporation, electroplating, electroless plating, and chemical vapor deposition, sputter deposition can allow for more variety with respect to selection of film materials, higher purity and controlled composition of the film, greater adhesive strength and homogeneity of the film, and greater control of the film thickness.

In conventional sputtering deposition systems, a substrate is generally conveyed through a vacuum chamber. The chamber contains a target made of or including sputterable material on its outer surface. Sputtering occurs when energized ion particles impinge on the target's surface, causing liberation of target atoms. In reactive sputtering, such liberated target atoms combine with reactive gas atoms to form a dielectric material, which is in turn deposited onto the substrate.

The deposition process often involves direct current ("DC") reactive sputtering. To achieve such sputtering, an electrical field is created in the vacuum chamber. Typically, a DC negative voltage is applied to the target in creating a cathode and a DC positive voltage is applied to other apparatus provided in the chamber at a location spaced away from the target in creating an anode. As such, the electrical field is created between the cathode and the anode. One or more gases are introduced into the vacuum chamber. Electrons in the electrical field are accelerated and gain enough energy to ionize the gas atoms and create glow discharge plasma. For example, an inert gas, such as argon, can be used in producing such plasma. Additional gases may also be introduced to chamber if desired, such as one or more reactive gases. As the ions are drawn to the target by the electric field of the cathode sheath, they bombard the target and liberate atoms. As described above, when such bombarding and liberating is conducted in the presence of a reactive gas such as oxygen or nitrogen, a reactive product of coating material (i.e., the product of the liberated target atoms and the reactive gas atoms) is generated, much of which is deposited on the substrate. For example, introducing a reactive gas such as oxygen or nitrogen to the chamber forms an oxide or nitride with the liberated target atoms.

Most of the voltage drop between the cathode and anode occurs over a distance of about 2 mm proximate to the cathode. This is due to the tendency of the plasma to form an electrical barrier commonly called the cathode sheath. A smaller sheath, the anode sheath, also forms proximate to the anode. As such, the bulk of the plasma has only a very weak electrical field that results from a gradient in charge density. The gradient is due to the relatively high density where the electrons are generated (at or near the cathode) and the relatively low density where the electrons are lost (at the anode). In some systems, the chamber walls or another conductive member positioned away from the target may be chosen to function as the anode.

As is known, with the ions being withdrawn from the plasma, an excess of electrons are left. It is a basic requirement that the plasma remains substantially charge neutral. It is also a requirement for the power source that there is equal electrical current going through the positive and negative output poles. Hence, the anode is provided to absorb the excess electrons and return them to the power source. However, this process can be compromised over time, as described below.

One disadvantage of DC reactive sputtering is a disappearing anode issue. This issue occurs when the anode gradually becomes coated with dielectric material. As is known, dielectric material often coats every surface in the chamber (including the substrate) and eventually coats the anode. When an area on an anode becomes coated, the conducting path for electrons in that area is compromised, causing the coated area to lose its ability to conduct electrons, and thereby cutting off the current path for electrons emitted from the process. When this happens, the electrons typically conduct to an uncoated area on the anode or, if the anode is covered by sputtered dielectric material, as quite often is the case, a less coated area on the anode.

Such less coated area is often a "hot spot" of the anode, i.e., an anode area that has a thinner coating of dielectric material than the other areas on the anode, so as to provide a path of least resistance for conducting electrons. Electrons flood to this hot spot. As electron current converges on this hot spot, this area heats up and vaporizes the coating in this area. This improves the conduction path to this spot even further. However, when such a dominant conduction path is established, the electron conduction in this spot becomes intense relative to the other coated areas on the anode and the effective geometry of the anode changes. In turn, as the anode geometry changes, the electric field (i.e., charge gradient) in the chamber also shifts. This shift has been found to cause changes in the film deposition pattern of the system. As a result, there are undesirable changes in film uniformity on the substrates.

Methods have been used to address the disappearing anode issue. Some methods involve using dual sputtering targets with AC power or bi-polar pulsed DC power instead of normal DC power. In these cases, one target acts as the sputtering cathode, which is sputtered clean during every other half-cycle and then acts as the anode during the other half-cycle. While these methods are effective, they require replacing existing power supplies and adding additional target assemblies. As a result, the methods requires additional capital investment, inventory and maintenance. Also, an AC pair of targets only has about the same power capability as a single DC sputtering target. As such, when compared to such DC systems, an AC system generally only provides half the sputtered deposition capability on a per-target basis.

Another method involves using a gas manifold as an anode. Generally, the gas manifold is isolated from ground and connected to a positive side of the output of a power supply. Gas enters into the manifold through an inlet and exits through one or more outlets. The pressure around the outlets is generally higher as compared to the rest of the sputtering chamber. When sputtering occurs, a majority, if not all, the outer manifold surfaces are eventually coated with a dielectric material.

However, the gas streaming outward from the manifold outlets prevents the sputtered material from coating over the outlets. The outlets then become the preferred conduction paths for electrons. These paths are somewhat enhanced due to the in-streaming electrons colliding with the out-streaming gas, which is at a locally elevated pressure. These collisions produce plasma plumes at each outlet. Since the plasma is electrically conductive, each plume serves as a virtual anode that cannot be coated.

One issue with the above gas manifold method is that the outer surfaces of the manifold (i.e., the anode) become coated with dielectric material from the sputtering process, as described above. This coating of the gas manifold can affect the overall functioning of the manifold as the anode. For example, at an initial stage of the deposition process, when the gas manifold is generally clean from any sputtered dielectric material, any surface of the gas manifold will be anodic, serving as a conduction path for electrons in the chamber back to the power source. However, as the outer surfaces of the gas manifold become coated with the sputtered dielectric material over time, the electrons gradually shift to conduction paths involving uncovered portions of the anode. Thus, the initial attractive effect established between the anode and the electrons is altered. This, in turn, changes the manner in which the plasma within the chamber is maintained, and as a result, can cause an undesirable shift in the coating function of the chamber.

As is known, a typical manifold in a sputtering system includes a tube with an inlet at one point and holes (e.g., drilled periodically along the tube's length) that act as the outlets. However, because there is a different gas conductance between the manifold inlet and each outlet, the distribution of gas is non-uniform. This can be modified, to a degree, by changing the relative size of the tube diameter and the outlet diameter. As the tube diameter is increased, the conduction path to each outlet is improved, leading to an improved gas distribution. Alternatively, reducing the conductance through the outlets helps improve distribution by increasing the pressure inside the tube, which enhances distribution of the gas. However, either of these modifications has the adverse effect of increasing the gas capacity of the tube. The capacity, i.e., the total amount of gas in the manifold, can be thought of as the product of volume and pressure. By increasing the gas capacity of the tube, response time is slowed for any closed loop feedback control used to control the gas. This is because all the gas in the manifold must exit the manifold before any change can take effect in the process chamber.

What are needed are apparatus and/or methods for overcoming the limitations described above.

SUMMARY

In certain embodiments, the present invention provides a sputtering apparatus comprising a vacuum chamber for containing a substrate to be coated via a sputtering process; a target adapted to be energized as a cathode and having a surface to be sputtered for coating the substrate; a gas supply; a binary gas manifold having an inlet and a plurality of outlets, wherein the inlet is operatively coupled to the gas supply and each of the outlets are located within the vacuum chamber, and wherein the inlet is in fluid communication via paths of at least substantially equal conductance with each of the outlets; and a conductive mass located within the gas manifold and electrically isolated from the gas manifold, wherein the conductive mass is adapted to be energized as an anode when the sputtering apparatus is in use.

In yet other embodiments, the invention provides an anode arrangement for a sputtering apparatus comprising a binary gas manifold having an inlet and a plurality of outlets, wherein the inlet is operatively coupled to a gas supply and each of the outlets are located within the vacuum chamber, and wherein the inlet is in fluid communication via paths of at least substantially equal conductance with each of the outlets; and a conductive mass located within the gas manifold and electrically isolated from the gas manifold, wherein the conductive mass is adapted to be energized as an anode when the sputtering apparatus is in use.

In yet a further embodiment, the present invention provides a sputtering apparatus comprising a vacuum chamber for containing a substrate to be coated via a sputtering process; a target adapted to be energized as a cathode and having a surface to be sputtered for coating the substrate; a gas supply; a gas manifold having an inlet and a plurality of outlets, wherein the inlet is operatively coupled to the gas supply and each of the outlets are located within the vacuum chamber; a conductive mass located adjacent to an inner surface of the gas manifold and electrically isolated from the gas manifold, wherein the conductive mass is adapted to be energized as an anode when the sputtering apparatus is in use; and a magnet at least partially encased within the gas manifold and located between the conductive mass and a portion of the gas manifold.

In certain embodiments, the present invention provides a sputtering apparatus comprising a vacuum chamber for containing a substrate to be coated via a sputtering process; a target adapted to be energized as a cathode and having a surface to be sputtered for coating the substrate; a gas supply; and a binary gas manifold having an inlet and a plurality of outlets, wherein the inlet is operatively coupled to the gas supply and each of the outlets are located within the vacuum chamber, wherein the inlet is in fluid communication via paths of at least substantially equal conductance with each of the outlets, wherein the gas manifold is adapted to be energized as an anode when the sputtering apparatus is in use, and wherein the gas manifold has outer surfaces that have a permanent coating of dielectric material thereon.

In yet other embodiments, the invention provides an anode arrangement for a sputtering apparatus comprising a binary gas manifold having an inlet and a plurality of outlets, wherein the inlet is operatively coupled to a gas supply and each of the outlets are located within the vacuum chamber, wherein the inlet is in fluid communication via paths of at least substantially equal conductance with each of the outlets, wherein the gas manifold is adapted to be energized as an anode when the sputtering apparatus is in use, and wherein the gas manifold has outer surfaces that have a permanent coating of dielectric material thereon.

In yet a further embodiment, the present invention provides a sputtering apparatus comprising a vacuum chamber for containing a substrate to be coated via a sputtering process; a target adapted to be energized as a cathode and having a surface to be sputtered for coating the substrate; a gas supply; a gas manifold having an inlet and a plurality of outlets, wherein the inlet is operatively coupled to the gas supply and each of the outlets are located within the vacuum chamber, wherein the gas manifold is adapted to be energized as an anode when the sputtering apparatus is in use, and wherein the gas manifold has outer surfaces that have a permanent coating of dielectric material thereon; and a magnet at least partially encased within the gas manifold and located adjacent to the outlets of the gas manifold.

DETAILED DESCRIPTION OF PREFERRED EMBODIMENTS

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Embodiments described herein generally relate to depositing a transparent dielectric film, such as a metal oxide film, on a substrate; however, the invention should not be limited to such. For example, the invention may also be used for metallic deposition processes. In the coated glass industry, the substrate would generally be a glass sheet. However, plastic and other types of substrates can also be used. The term "metal" is used to indicate such elements as zinc, aluminum, titanium, niobium, zirconium, etc. In addition, the term metal is defined so as to also include silicon and other metalloids not normally considered to be metals.

More particularly, embodiments described herein relate to sputtering a metal-containing target within a controlled chamber by introducing a gas into the chamber via a gas manifold. The gas can include a single gas or a mixture of two or more gases. In certain embodiments, the gas includes one or more inert gases, such as argon, and/or one or more reactive gases, such as oxygen, nitrogen, etc. Preferably, the gas is introduced into the sputtering chamber in a manner enabling one to control the ratio of mass flow rates of the gases.

Embodiments of the invention generally involve the gas manifold having an inlet and a plurality of outlets, whereby the inlet is in fluid communication via paths of equal conductance, or substantially equal conductance, with each of the outlets. In certain embodiments, the gas manifold is a binary manifold where the inlet is evenly split into two paths of equal conductance. In certain embodiments, each of the two paths can be continually and evenly split into further paths until a quantity of the paths equals a desired plurality of outlets. For example, if sixteen outlets are desired, the two paths stemming from the inlet would be evenly split, and subsequently, the resulting four paths would each be evenly split, and further, the resulting eight paths would each be evenly split to provide the desired sixteen outlets. Such is a case in which the paths of the manifold would generally have equal conductance. However, the gas manifold may instead be configured for providing paths of substantially equal conductance. As such, if fourteen outlets are desired, using the above example, six of the eight resulting paths can be evenly split to provide a gas manifold system with fourteen paths of substantially equal conductance. The remaining two of the eight resulting paths may be dimensionally adjusted to have similar conductance, albeit physically dissimilar, as the other twelve paths (provided from the six evenly-split paths).

Embodiments of the invention generally relate to configuring the gas manifold to provide an anode within the sputtering chamber. In certain embodiments, the gas manifold itself is charged as the anode (exemplarily represented in FIGS. 2, 3, and 7). Alternatively, in certain embodiments, a conductive mass is charged as the anode and contained within the gas manifold (exemplarily represented in FIGS. 4, 5, 8, and 9). In certain embodiments, as described above, the gas manifold is a binary manifold (having paths of equal, or substantially equal, conductance) although the embodiments of the invention are equally applicable to non-binary manifolds.

The gas manifold, in any of its exemplary representations (as described below), can be used in sputter depositing a wide variety of coatings. As such, the invention should not be limited based on any specific coating being deposited. In certain embodiments, a method of depositing an oxide film can be provided in using the gas manifold. For example, the method can involve providing a sputtering chamber (such as that exemplified in FIG. 1 as described below) equipped with at least one sputtering target. Each target can optionally comprise metallic sputterable material (although, the sputterable material can alternatively be an oxide, such as a suboxide). The method can be advantageously used for sputter depositing an oxide film selected from the group consisting of zinc oxide, tin oxide, zinc tin oxide, titanium oxide, and silicon oxide.

As described below, the gas manifold, in any of its exemplary representations, can be provided to increase ionization during sputtering. This may provide improved film properties, such as density, morphology, etc. In certain embodiments, a method for depositing a film on a #1 surface of a substrate (e.g., the exterior surface of an outboard pane of a window or other glazing) can be provided. For example, the method may involve depositing the film on a desired surface of a pane, and then installing the pane such that the thus coated surface is a #1 surface exposed to an outdoor environment (optionally exposed to periodic contact with rain). In certain embodiments, the film may comprise silica and/or titania; however, as described above, the invention should not be limited to such. For example, the film can comprise silica that is deposited directly on the pane. Another example can involve depositing a coating comprising titania (e.g., TiO2). The coating, for example, can be a photocatalytic coating, and low-maintenance properties of the TiO2 may be improved due to the increased ionization provided by the manifold.

Further, in certain embodiments, at least one gas manifold may be mounted below a path of substrate travel (e.g., at a lower elevation than transport rollers or another substrate support) extending through a sputtering chamber. In such embodiments, the sputtering chamber includes at least one lower sputtering chamber, which is/are mounted below the path of substrate travel. In operation, the method involves sputtering each lower target(s) upwardly (optionally between spaced-apart transport rollers) so that sputtered film is deposited upon a bottom surface of a substrate being conveyed through the chamber.

Figure 1:
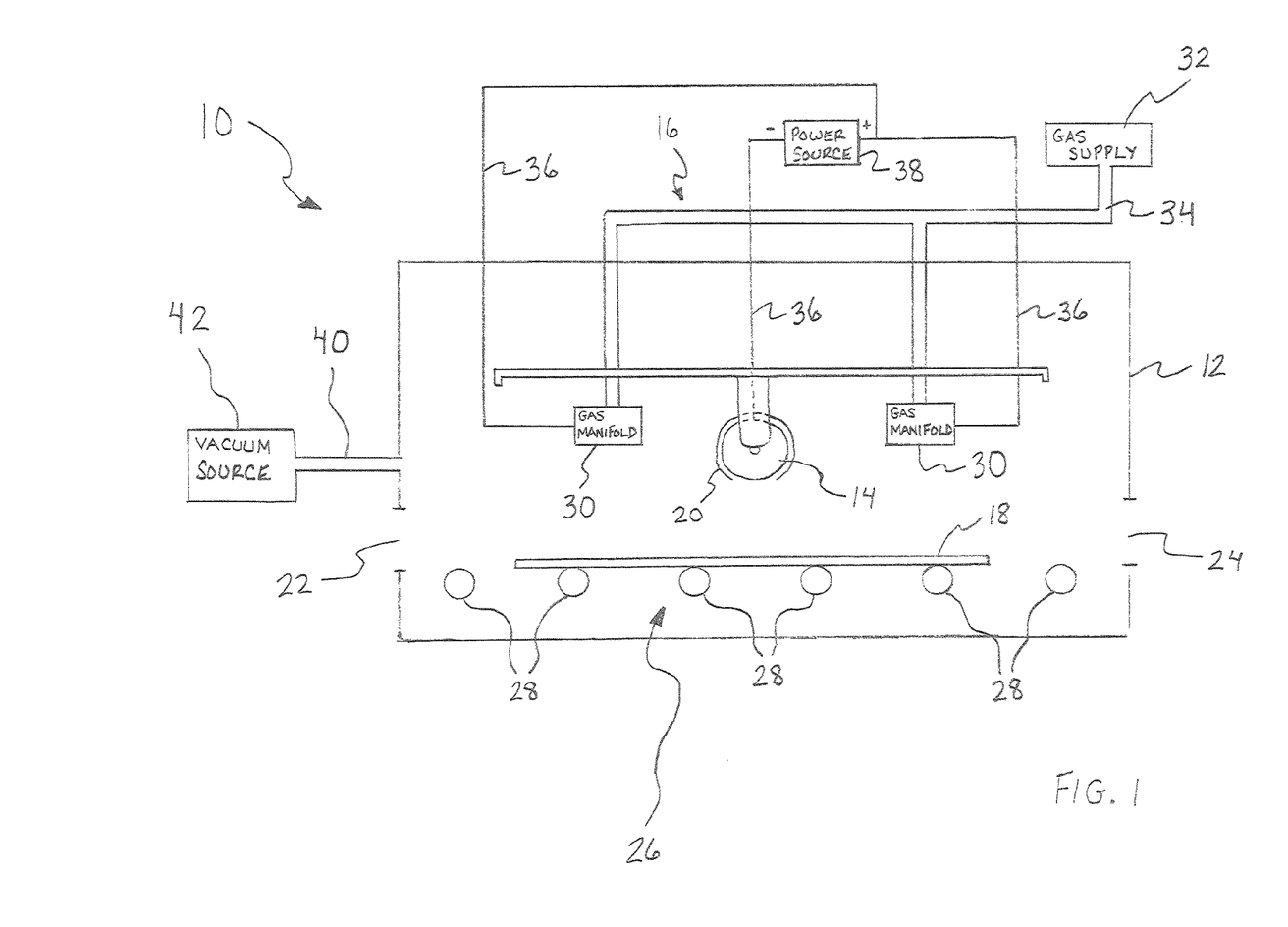
FIG. 1 is a schematic side view of a sputtering apparatus in accordance with certain embodiments of the present invention.

FIG. 1 illustrates a schematic front view of a magnetron sputtering system 10 in accordance with certain embodiments of the invention. Sputtering techniques and equipment utilized in magnetron sputtering systems are quite well known in the art. For example, magnetron sputtering chambers and related equipment are available commercially from a variety of sources (e.g., Leybold). Examples of useful magnetron sputtering techniques and equipment are also disclosed in a number of United States patents, such as U.S. Pat. No. 4,166,018, issued to Chapin, the applicable teachings of which are incorporated herein by reference.

The system 10 of FIG. 1 includes a deposition chamber 12 defining a controlled environment (i.e., a vacuum chamber); a target 14; and a gas distribution system 16. The deposition chamber 12 generally includes metallic walls, typically made of steel or stainless steel, operably assembled to form a chamber that can accommodate a vacuum in which the sputtering process occurs. Within or partially within the deposition chamber 12 is the target 14. As should be appreciated, the target 14 can generally be any shape, e.g., cylindrical or planar, and even though only a single target 14 is shown in FIG. 1, two or more targets 14 can be used within the chamber 12 without departing from the spirit of the present invention.

In some embodiments, the target 14 includes a tubular backing formed of electrically conductive material, such as stainless steel, aluminum or any other suitably conductive material. The outer surface of the target 14 is defined by sputterable material. Alternately, the target 14 can be planar and can include a conductive backing plate, with a slab of the target material to be sputtered affixed to the backing plate by any mechanical method or by solder or adhesive as is well known to those of ordinary skill in the art. In some cases, the entire target 14 can be formed of the material to be sputtered. As briefly described above, sputterable target materials include, but are not limited to, materials such as silicon, zinc, tin, aluminum, copper, titanium, niobium, zirconium, or combinations thereof. Preferably, atoms of these target materials can be reacted with atoms of a reactive gas, such as oxygen, nitrogen, etc., or combinations thereof, to form dielectric coatings, such as zinc oxide, silicon nitride or the like. The target 14 can include one or more optional shield assemblies 20 and optional magnet assemblies (not shown), and in the case of a rotating cylindrical target, is further connected to a motor assembly (not shown). As is known, for rotating cylindrical cathodes, such motor assemblies optimize the efficiency of the target 14 by rotating the target 14 through the plasma generated in the sputtering system 10.

The deposition chamber 12 optionally includes an entry door (or "tunnel") 22 and exit door (or "tunnel") 24 for the substrate 18, thereby enabling continual feeding of substrates (or work pieces) through the chamber 12. A support system 26 for the substrate 18 may include transport rollers 28, but may alternatively include conveyor belts. The illustrated substrate 18 rests upon the transport rollers 28 and is brought into the deposition chamber 12 through the entry door 22 via rotation of the rollers 28. The rollers 28 may be rotated at a speed that results in the substrate moving through the chamber at about 100-500 inches per minute. Once the substrate 18 has been coated, it exits the illustrated deposition chamber 12 through the exit door 24.

The gas distribution system 16 generally includes one or more gas manifolds 30, through which one or more sputtering gases are introduced into the deposition chamber 12; a gas supply 32; and a gas conduit 34, through which gas is delivered from the gas supply 32 to the gas manifolds 30. While two gas manifolds 30 are exemplarily shown in FIG. 1, with each represented as a block, it is to be appreciated that embodiments of the invention can include any number of (e.g., one or more) gas manifolds. In certain embodiments, high current electric conductor lines 36 electrically connect a power source 38 to the target 14 and one or more other components of the gas distribution system 16. As further described below, in accordance with certain embodiments of the present invention, a positive voltage is delivered (e.g., via one or more of the electric conductor lines 36) to the gas manifolds 30 (exemplarily represented in FIGS. 2, 3, and 7) or to a conductive mass 64 located therein (exemplarily represented in FIGS. 4, 5, 8, and 9), thereby creating anodic surfaces that are positioned in sufficient proximity to the target 14. This positioning of the anodic surface or surfaces assists in maintaining the plasma and stabilizing the zone of sputtering gas adjacent to the exterior surface of the target 14 (sputtering zone).

In the sputtering process, after the initial preconditioning of the deposition chamber 12, the gas supply 32 provides a supply of gas, e.g., an inert gas such as argon, through the gas manifolds 30. The gas can involve one or more gases. The system 10 can involve other gases being provided through the gas manifolds 30 in combination with, or instead of, an inert gas. As such, while there is only one gas supply 32 and one gas conduit 34 represented in the system 10, there can alternatively be a plurality of gas supplies and gas conduits each connecting one of the gas supplies to the gas manifolds 30 without departing from the spirit of the invention. For example, the deposition chamber 12 can be operably connected to both a supply of oxygen gas and a supply of argon gas via respective gas conduits connecting to the gas manifolds 30. Such respective gas distribution pipes would enable oxygen and argon gases to flow into the chamber 12. In addition, oxygen and argon gases may be mixed together before they enter the gas manifolds 30, or may be introduced separately into the manifolds 30. The flow of each gas into the gas manifolds 30 can be set at different mass flow rates. As such, flow regulators (not shown) are preferably employed to control the flow rate of each gas into the gas manifolds 30, and in turn, into the chamber 12. For example, the gas may be introduced to the deposition chamber 12 until a pressure in the range of about 1 mTorr-20 mTorr is achieved. In order to maintain the chamber pressure in the range of about 1 mTorr-20 mTorr in this example, additional gas is added over time.

As described above, using a conventional tube-shaped gas manifold (e.g., having holes drilled through the tube surface to serve as the manifold outlets) in a deposition chamber often results in a non-uniform distribution of gas being provided from such manifold. This is generally disadvantageous because it compromises the homogeneity of the plasma created in the deposition chamber. In turn, non-homogeneous plasma can eventually lead to uneven deposition. As described above, while various methods of configuring such tube-shaped gas manifolds have been used to enable a more uniform gas distribution, such methods have generally been found to negatively impact the gas capacity of the manifolds. In turn, the response time of these gas manifolds is compromised. To overcome these limitations, in certain embodiments, a gas manifold is used having equal, or substantially equal, conductance paths between an inlet and each outlet of the manifold. In certain embodiments, a binary manifold is used. Using a gas manifold having equal, or substantially equal, conductance paths one can achieve uniform gas distribution while also maintaining response time of the manifold. As a result, more homogeneous plasma can be achieved so as to promote a consistent deposition process.

Figure 2:
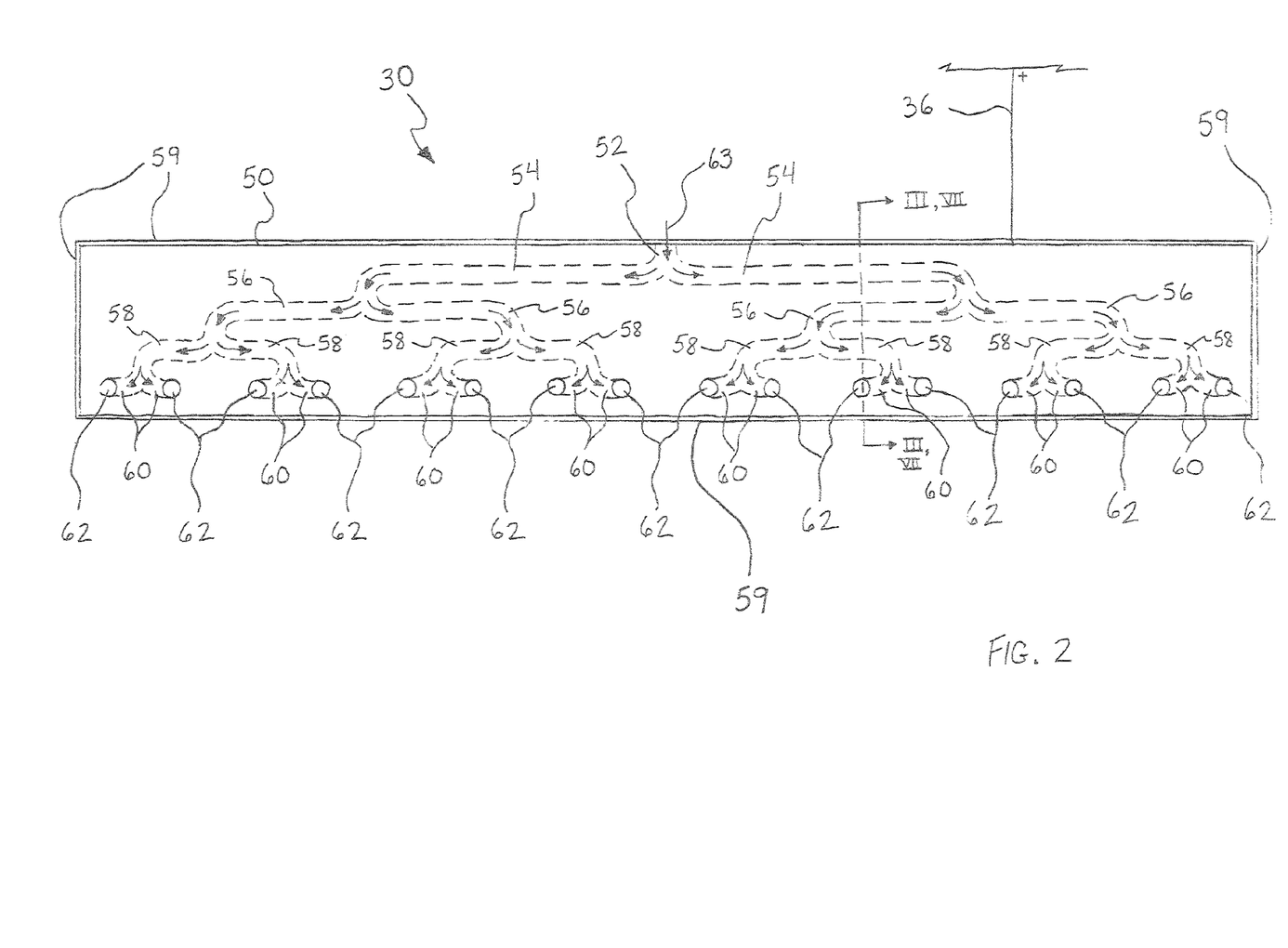
FIG. 2 is a schematic front view of a gas manifold assembly of FIG. 1 in accordance with certain embodiments of the present invention.

FIG. 2 shows a schematic front view of a gas manifold 50 that can be used for the gas manifold 30 of FIG. 1 in accordance with certain embodiments of the invention. As shown, a gas inlet 52 of the gas manifold 50 communicates to a gas path that communicates to at least two different gas flow lengths. In certain embodiments, as shown, the gas manifold 50 is a binary manifold. As such, the manifold 50 includes a gas inlet 52 which is split into two equal, or substantially equal, conductance paths 54. While such a binary manifold need not have symmetrical outlet arrangements or the same number of outlets stemming from the different gas flow lengths, this may be advantageous. As such, in certain embodiments, each of the paths 54 are split into two more equal, or substantially equal, conductance paths 56. Further, each of the paths 56 is again split into two more equal, or substantially equal, conductance paths 58. Finally, each of the paths 58 is further split into two more equal, or substantially equal, conductance paths 60, with each of the paths 60 terminating at a distinct outlet 62 of the manifold 50. Examples of the manifold inlet 52 and paths 54, 56, 58, and 60 include, but are not limited to, tubes, hollow shafts, ducts, hollow bars, hollow beams, or passages through a wall or walls of the manifold. As should be appreciated, the number of times the initial paths 54 are split is dependent on the desired number of outlets 62. As such, the present invention should not be limited to the configuration of FIG. 2. Moreover, as exemplified above, the initial paths 54 need not lead to the same number of outlets.

As described above, in using the binary manifold 50 for one or more gas manifolds 30 of FIG. 1, the same conductance path can be advantageously provided between the inlet 52 and each outlet 62 of the manifold 50 with very little capacitance being allowed. In certain embodiments, each conductance path has an equal flow resistance. Thus, in the system 10 of FIG. 1, when a binary manifold, e.g., manifold 50 of FIG. 2, is used for each of the gas manifolds 30, a uniform distribution of inflowing gas 63 (referenced in FIGS. 2-4 as arrows) can be provided from the manifold 50 and a decreased (that is to say, improved) response time relating to the gas 63 flowing through the manifold 50 can be achieved in comparison to conventional tube-shaped gas manifolds.

As described above, in certain embodiments with reference to FIG. 1, each of the gas manifolds 30 is configured to provide an anode within the sputtering chamber. Some of these embodiments involve the gas manifold 30 being charged as the anode. Such a configuration is exemplarily represented in FIGS. 2 and 3 with the gas manifold 50. Alternatively, some of these embodiments involve a conductive mass 64 being contained within each of the gas manifolds 30 and charged as the anode. Such a configuration is exemplarily represented in FIG. 4, with the conductive mass 64 being shown inside a gas manifold 50' adjacent the outlets 62'. As should be appreciated, the gas manifold 50' of FIG. 4 is generally the same as the gas manifold 50 of FIG. 2 except for the inclusion of the conductive mass 64 therein, and, in some cases, materials used for permanently coating one or more surfaces of one or more of the conductive mass 64 and the gas manifold 50'. The positioning of the conductive mass 64 with respect to the manifold 50' is more clearly shown in FIGS. 5 and 6, each of which illustrates a schematic cross-sectional side view of the manifold 50' of FIG. 4 in alternative embodiments.

Figure 4:
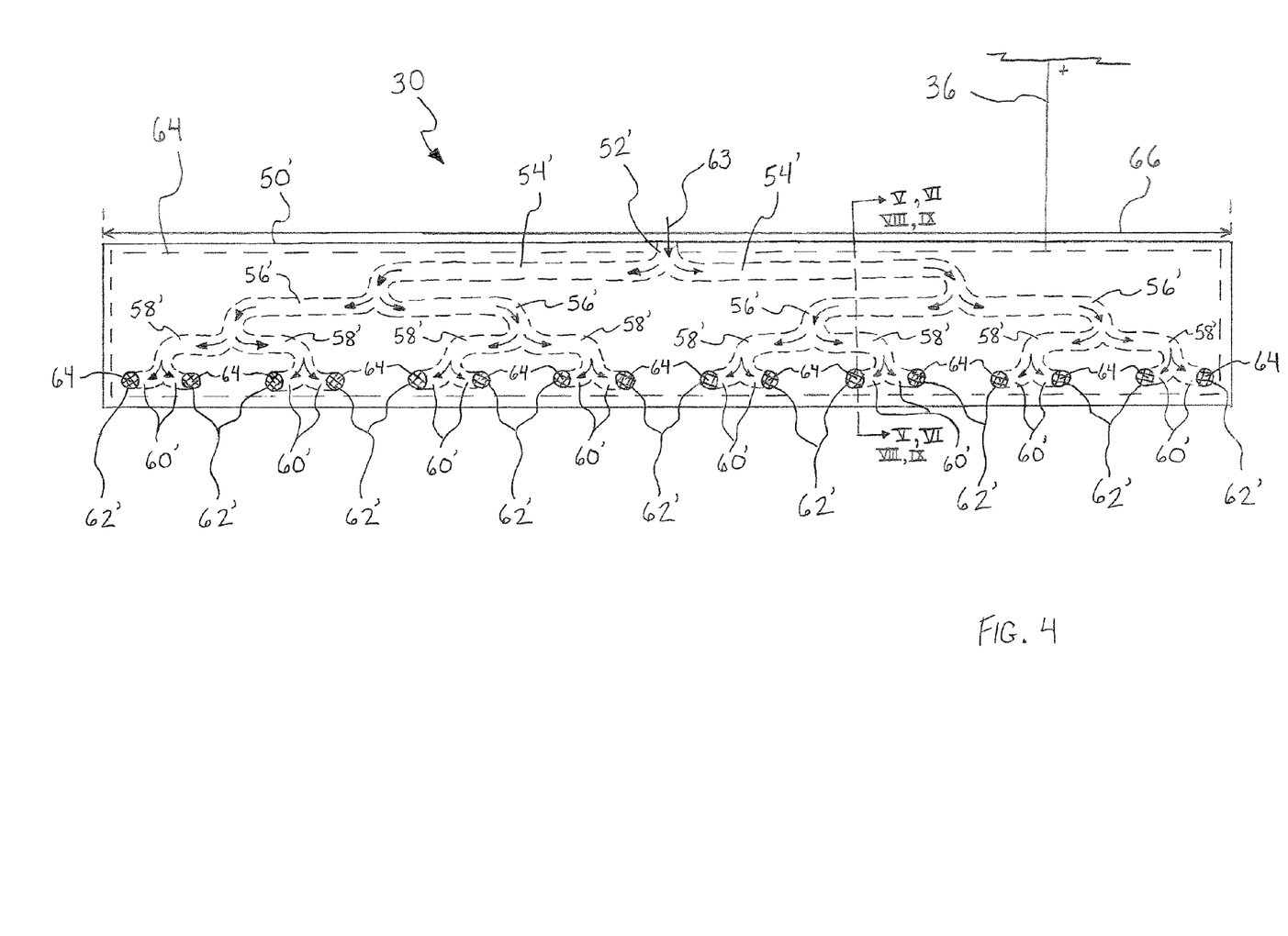
FIG. 4 is a schematic front view of a gas manifold assembly of FIG. 1 in accordance with certain embodiments of the present invention.
Figure 5:
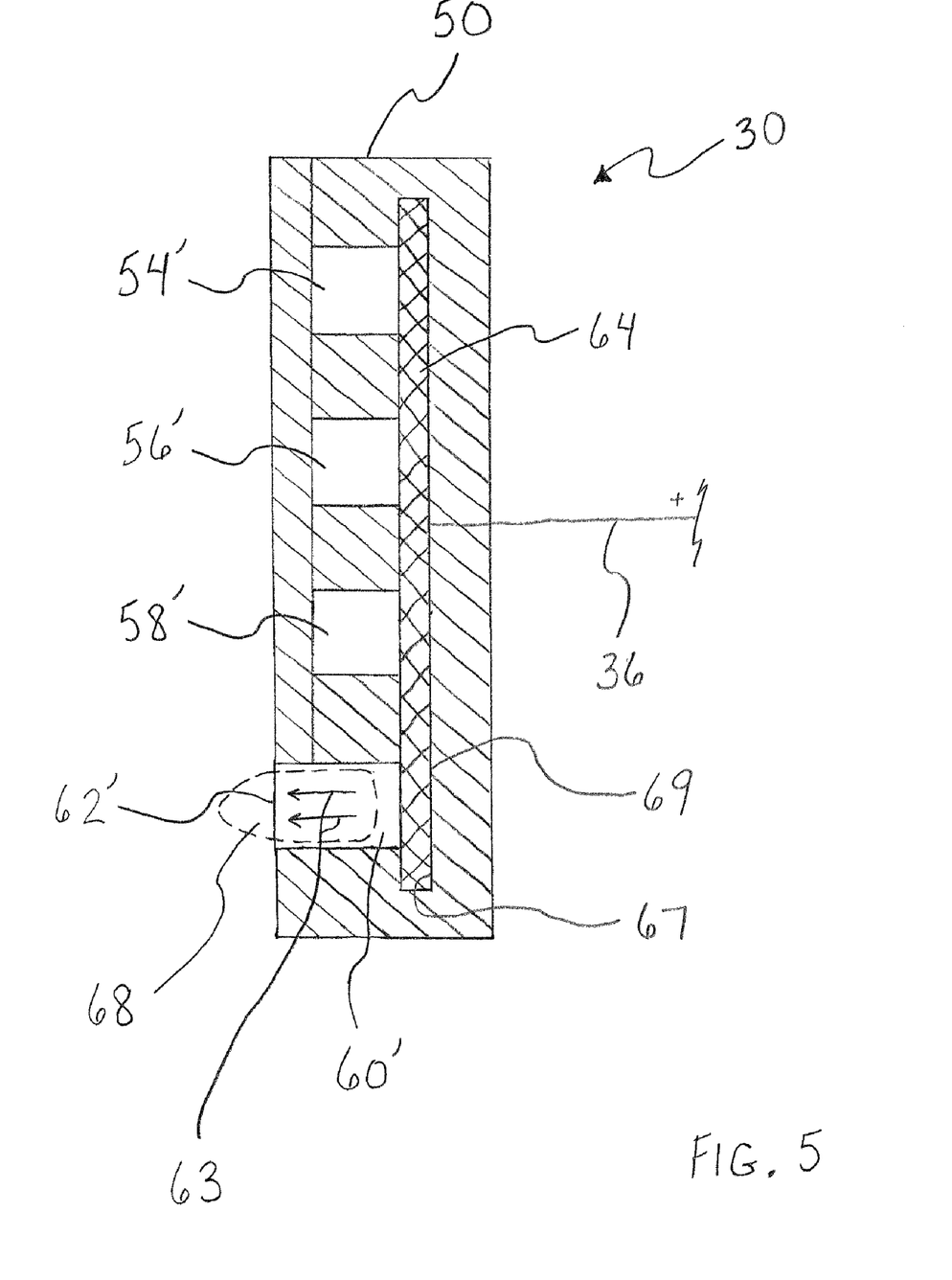
FIG. 5 is a schematic cross sectional view of the gas manifold assembly of FIG. 4 taken along the line V-V in accordance with one embodiment of the present invention.
Figure 6:
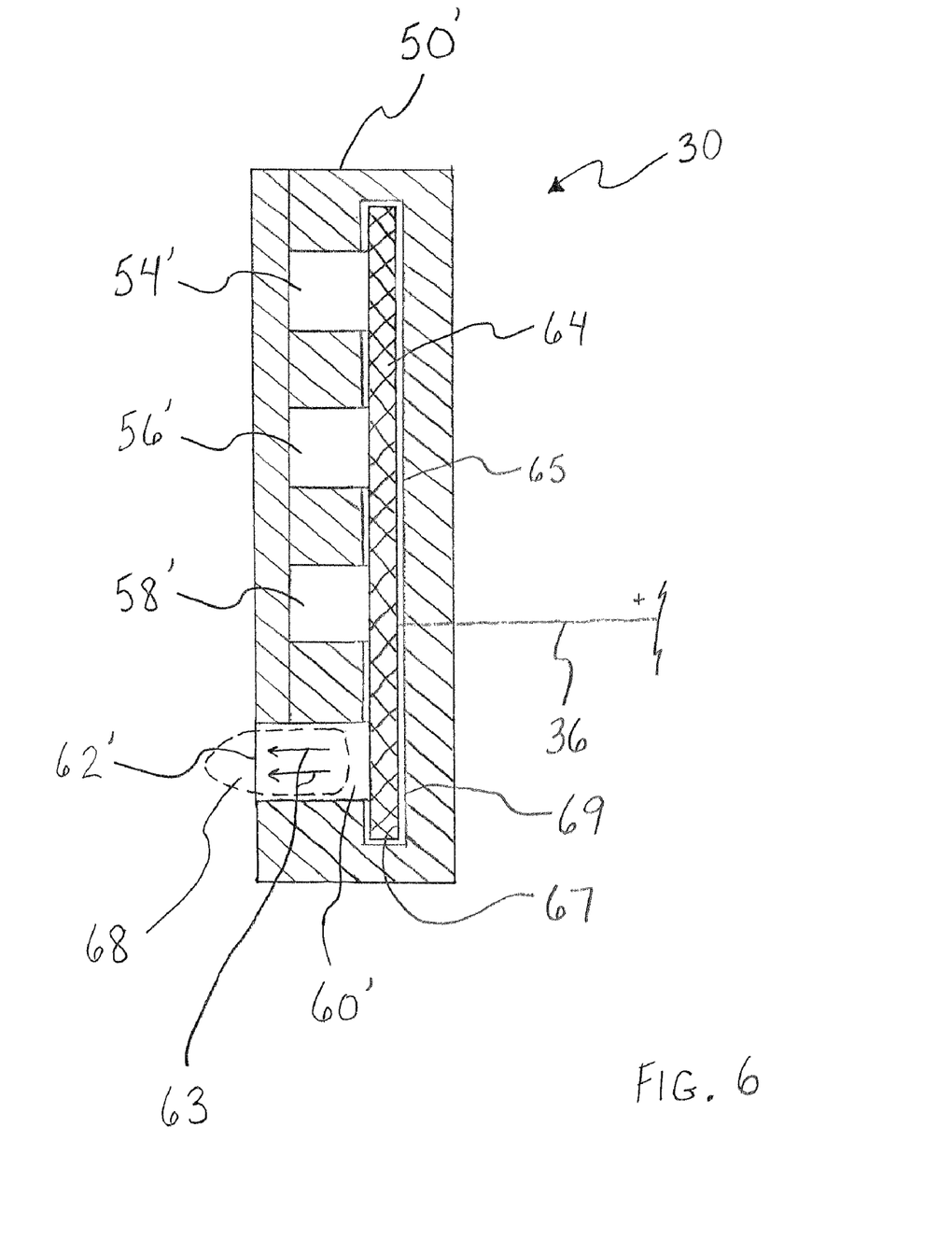
FIG. 6 is a schematic cross sectional view of the gas manifold assembly of FIG. 4 taken along the line VI-VI in accordance with another embodiment of the present invention.

With respect to FIGS. 4-6, in certain embodiments, the conductive mass 64 is provided as one or more members. For example, the conductive mass 64 can be provided as one or more plates (e.g., water-cooled copper plates). When provided as a single member, the conductive mass 64 preferably extends at least partially across a major dimension 66 (optionally a length) of the manifold 50' (such dimension 66 shown in FIG. 4) so as to be loacted adjacent to and behind one or more (e.g., each) of the manifold outlets 62'. Alternatively, when the conductive mass 64 is provided as a plurality of members, each member may be separately located adjacent to one or more of the manifold outlets 62', with such arrangement of members at least partially extending across the major dimension 66 of the manifold 50'. When the conductive mass 64 is provided as a plurality of members incorporated within the manifold 50', in certain embodiments, the members may be individually controlled to draw varying amounts of electrical current, relative to one another, so as to actively control the uniformity of the process.

In some embodiments, the manifold 50' has a conductive mass 64 that spans along at least half of, and perhaps substantially the entire length 66 of, the manifold 50'.

As should be appreciated, other known sputtering systems have (i) used a gas manifold as the anode and/or (ii) employed a conductive member outside a gas manifold body as the anode (e.g., U.S. Patent Application Publication No. US2004/0118678). In such systems, plasma flame or gas flow generally provides a cleaning function, thereby maintaining conductive surfaces on the anodes and preventing or diminishing the deposition of nonconductive target material on the conductive surfaces. For example, when a gas manifold is employed as the anode, the surfaces of the manifold contacted by the out-flowing gas (e.g., the inner surfaces and the outlets of the manifold) are generally kept free from dielectric material. Alternatively, in cases in which a conductive member outside a gas manifold body is employed as the anode, the manifold outlets can be directed at the member to clean a portion thereof to ensure such cleaned portion remains conductive.

However, each of these sputtering systems allows significant portions of the anode body to be covered by dielectric material, limiting its conducting surfaces. While the above methods of keeping conductive surfaces on the anode clean have assisted in providing plasmas in deposition chambers, it would be preferable to have a system in which a larger area (optionally the entire anode or a majority thereof) is protected from being coated during the deposition process. Preferably, one can initially establish certain conduction paths for the electrons back to the power source of the deposition system, and further maintain these same conduction paths over time. As a result, such a system would be better equipped in ensuring that the stability of the plasma is maintained so as to achieve consistent sputtering within the chamber. As further described below, the conduction paths of such systems may also be enhanced in comparison to other conventional systems (e.g., as exemplified above). In brief, because the electrons do not have the ability to use other conduction paths to return to the power source, increased quantities of electrons would travel across these paths. The increased electron quantities, in turn, lead to an increase in collisions between the electrons and the gas flowing from the gas manifold, creating plasma plumes at the outlets of the gas manifold. Consequently, ionization rate of the gas flowing from the gas manifold is also increased. Increased creation of ions may cause greater sputtering of the target and a more efficient sputtering process. It may also provide higher quality film (increased density, better morphology, etc.). The above-described protection of an anode can be achieved in a number of ways.

Figure 3:
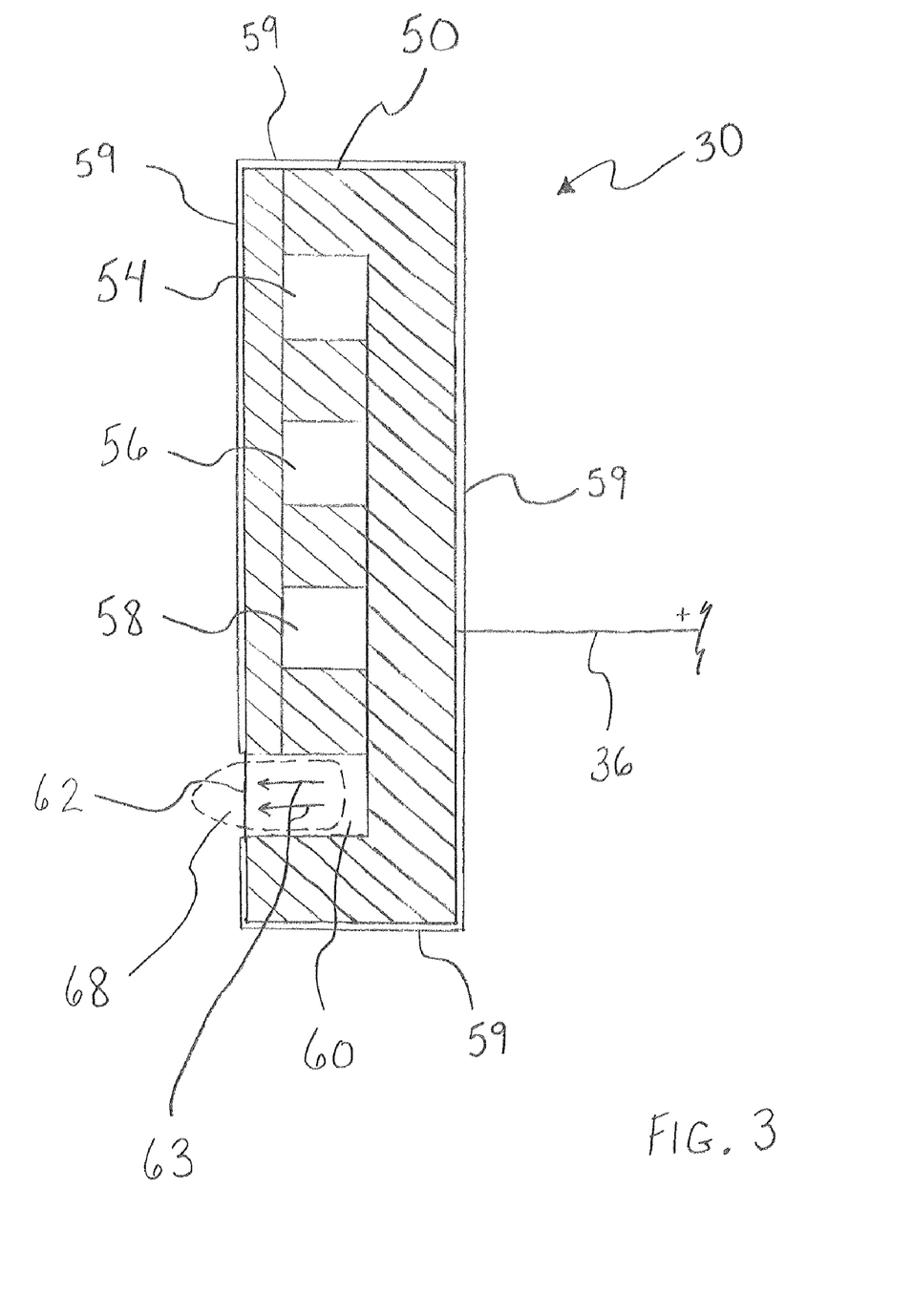
FIG. 3 is a schematic cross sectional view of the gas manifold assembly of FIG. 2 taken along the line III-III in accordance with one embodiment of the present invention.

For example, in certain embodiments, as shown in FIGS. 2 and 3, the gas manifold 50 is charged as the anode (e.g., via electric conductor line 36), yet protected from the dielectric material which coats exposed surfaces within the chamber during the deposition process. This protection of the anode is achieved by providing the outer surfaces of the gas manifold 50 with a permanent coating 59 of dielectric material prior to its use. While the outer surfaces of the gas manifold 50 may be covered with sputtered material during the sputtering process, the dielectric coating 59 prevents these outer surfaces from being conductive and from attracting electrons in the deposition chamber in the first place. As a result, the gas manifold 50, underneath the coating 59 and charged as the anode, is effectively protected and will not be impacted by the sputtered dielectric material. In turn, the gas manifold 50, and in particular, the inner surfaces of the gas manifold 50, are initially established and maintained (e.g., throughout the sputtering process) as the only paths for electrons to return to the power source of the deposition system, thereby providing effective maintenance of the plasma and consistent coating within the chamber. As should be appreciated, the temperature of the manifold 50 can be kept from overheating through introduction of one or more coolant channels (not shown) in thermal communication with (e.g., running through) the manifold 50.

In certain embodiments, as shown in FIGS. 4-6, a conductive mass 64 can be charged as the anode (e.g., via electric conductor line 36) and contained within the gas manifold 50'. As should be appreciated, the conductive mass 64 is protected from the sputtered material that coats exposed surfaces within the chamber during the deposition process because it is housed within the gas manifold 50'. In the exemplary embodiments of FIGS. 5 and 6, the conductive mass 64 is positioned behind each of paths 54', 56', 58', and 60' of the manifold 50' and is only accessible to electrons in the deposition chamber 12 through outlets 62' in the manifold 50'. As illustrated in FIGS. 5 and 6, the conductive mass 64 has a surface (e.g., surface 67) adjacent to an inner surface (e.g., surface 69) of the manifold 50'. In certain embodiments, the conductive mass 64 is partially embedded within the manifold 50', as shown by having the conductive mass 64 surrounded on one or more sides (optionally being surrounded entirely other than at the gas outlets 62') by the manifold 50'. However, the conductive mass 64 is preferably prevented from electrically conducting with the gas manifold 50'. As such, while the gas manifold 50' may be coated by dielectric material during the deposition process, there is no consequential effect on the conductive mass 64. Thus, the conductive mass 64 is initially established and maintained as a path for electrons to return to the power source of the deposition system, thereby providing effective maintenance of the plasma and consistent coating within the chamber. As can be appreciated, preventing electrical conductance between the conductive mass 64 and the gas manifold 50' can be achieved in a variety of ways.

For example, in certain embodiments, as shown in FIG. 5, the gas manifold 50' is made, or formed, of dielectric material. Alternatively, in certain embodiments, only portions of the gas manifold 50' in contact with the conductive mass 64 are made, or formed, of dielectric material. Another example, in certain embodiments, as shown in FIG. 6, involves permanently coating the conductive mass 64 with a dielectric coating 65. In such cases, only the surfaces of the conductive mass 64 in contact with the gas manifold 50' (i.e., when the mass 64 is positioned in the manifold 50') are permanently coated with the dielectric coating 65. Alternatively, it may be the case that portions of the gas manifold 50' in contact with the conductive mass 64 (i.e., when the mass 64 is positioned in the manifold 50') are permanently coated with the dielectric coating 65. As such, the gas manifold 50' of FIG. 6 can be formed of any material (i.e., conductive or otherwise). In summary, the conductive mass 64, used in either manifold 50' of FIGS. 6 or 7, preferably is electrically isolated from the gas manifold 50', thereby initially establishing and maintaining the conductive mass 64 as the path for the electrons to return to the power source of the deposition system.

As should be appreciated, the gas manifold 50 of FIGS. 2-3 or the gas manifold 50' of FIGS. 4 and 5 or FIGS. 4 and 6 can be implemented as the gas manifolds 30 of the system 10 of FIG. 1. As described above, in using the system 10, an electrical field is initially created. For example, a DC negative voltage of the power source 38 can be electrically connected to the target 14 in creating a cathode and a DC positive voltage of the power source 38 can be electrically connected to the gas manifold 50 (wherein the gas manifold 50 of FIG. 3 is substituted for the gas manifold 30) or the conductive mass 64 within the manifold 50' (wherein the gas manifold 50' of either FIGS. 5 or 6 is substituted for the gas manifold 30). As noted above, the electric field is most prominent in the cathode and anode sheaths. As also described above, the high current electric conductor lines 36 can be used for such electrical connections. In certain embodiments, a tube used to carry cooling fluid may also be used as the high current electric conductor line. This can optionally be the case for any embodiment of this disclosure. The gas 63 is provided to the manifold 50 or 50' via the gas supply 32. The gas supply 32 is operatively coupled to the manifold inlet 52 or 52' via the gas conduit 34. As should be appreciated, an insulator (not shown) is generally included with the gas conduit 34 to prevent any discharge or surge of electrical energy through the gas conduit 34 back to the gas supply 32.

As similarly described above with respect to conventional tube-shaped gas manifolds, during repeated sputtering operations of the system 10, the exterior surfaces of the manifold 50 or 50' (within the deposition chamber 12) can be eventually coated with dielectric material during the deposition process. However, the gas 63 streaming outward from the manifold outlets 62 or 62' provides resistance to the sputtered material being coating over the outlets 62 or 62', and in turn, over the interior surfaces of the manifold 50 or the manifold 50' (including the conductive mass 64). Additionally, since the manifold 50 in some embodiments has a permanent coating 59 of dielectric material on its outer surfaces and since a conductive mass 64 may be electrically isolated from the manifold 50', in both cases, the anode (the manifold 50 or the conductive mass 64) is entirely protected from the sputtered material. As a result, paths to the inner surfaces of the manifold 50 or to the conductive mass 64 are initially established and maintained as the preferred conduction paths for electrons in the deposition chamber 12. These paths become enhanced due to the in-streaming electrons colliding with the out-streaming gas 63, which is at a locally elevated pressure. In turn, the collisions between the electrons and the out-flowing gas produces plasma plumes 68 at each of the outlets 62 or 62', with such plumes 68 serving as virtual anodes that cannot be coated. In addition, in certain embodiments, by using manifolds having equal, or substantially equal, conductance paths (e.g., binary manifolds, as described above) as the manifolds 50 or 50' (as opposed to conventional gas manifolds), ensures that a uniform distribution of gas flow through the manifold 50 or 50' is achieved. As such, the process intensity can be maintained substantially uniform along the length of the sputtering target 14 so that the deposition of the film is also substantially uniform.

Between the plasma plumes 68 and the inner surfaces of the manifold 50 or the conductive mass 64, a sheath is formed, with a voltage drop equal to the potential difference between each of the plasma plumes 68 and the inner surfaces of the manifold 50 or the conductive mass 64. Ions generated in the sheath are electrically ejected in a direction normal to, and away from, the inner surfaces of the manifold 50 or the conductive mass 64. If created from reactive gases, the ions are much more reactive than neutral reactive gas. In turn, such activated gas (which can be directed toward the substrate 18), can facilitate depositing fully reacted film while reducing the partial pressure of the reactive gas in the chamber 12, and hence, the amount of reactive gas at the target 14. In turn, this may result in an enhanced deposition output from the system 10, e.g., higher sputter rate, and in turn, higher deposition rate and reduced energy consumption.

In summary, an anode can be protected (desirably entirely protected) to initially establish and subsequently maintain the travel paths of electrons of the reactive atmosphere in the chamber to return to the power source of the chamber via the anode (i.e., the gas manifold 50 or the conductive mass 64). Such implementations are provided to maintain the plasma established in the chamber during the deposition process, leading to a more consistent sputtering process. Consequently, as described above, the anode's functionality in the system 10 is enhanced in comparison to other conventional systems (e.g., which may provide for the manifold as the anode and/or for a conductive member outside the manifold body being employed as the anode, yet have anodic functionality which changes over time due to surfaces of the anode being covered by sputtering material).

Figure 7:
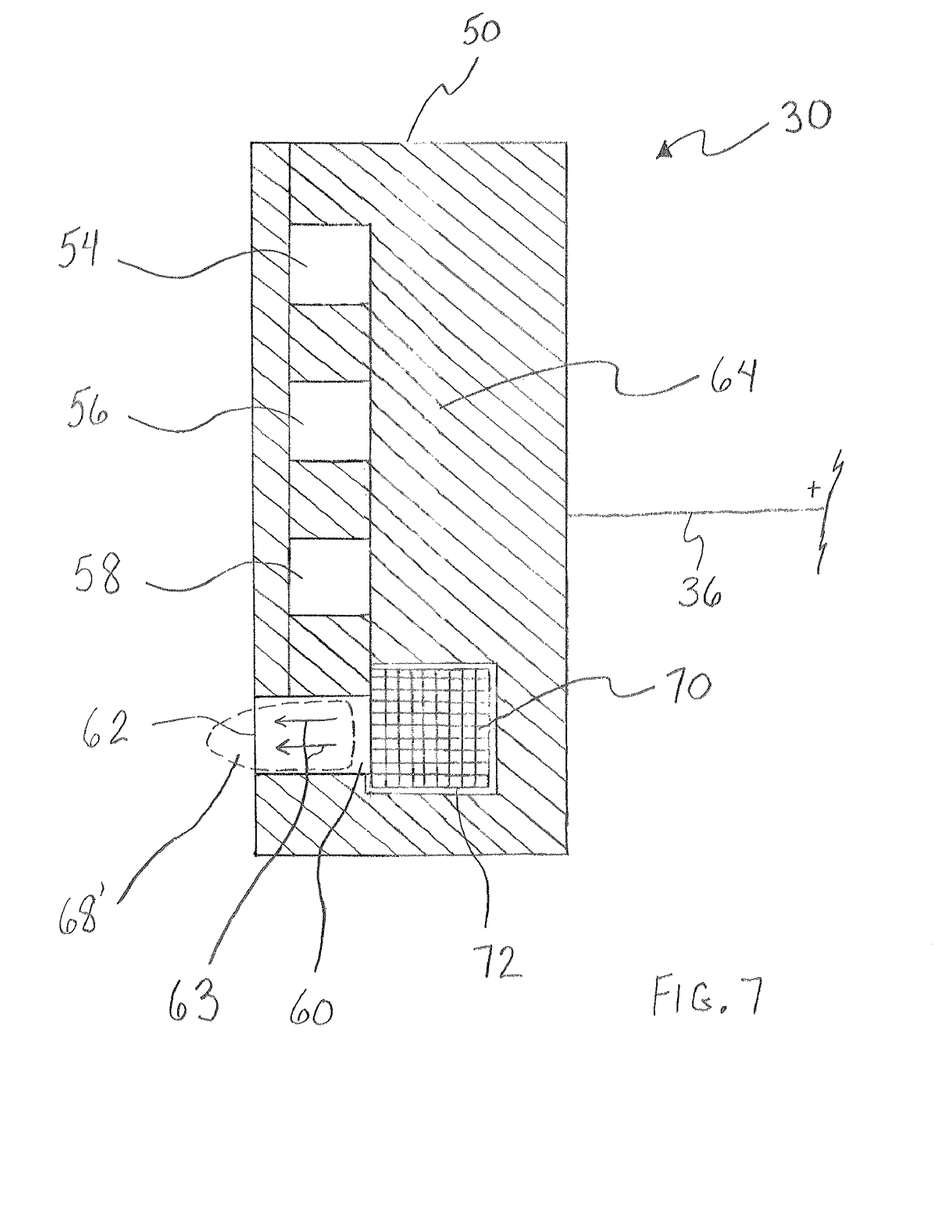
FIG. 7 is a schematic cross sectional view of the gas manifold assembly of FIG. 2 taken along the line VII-VII in accordance with another embodiment of the invention.
Figure 8:
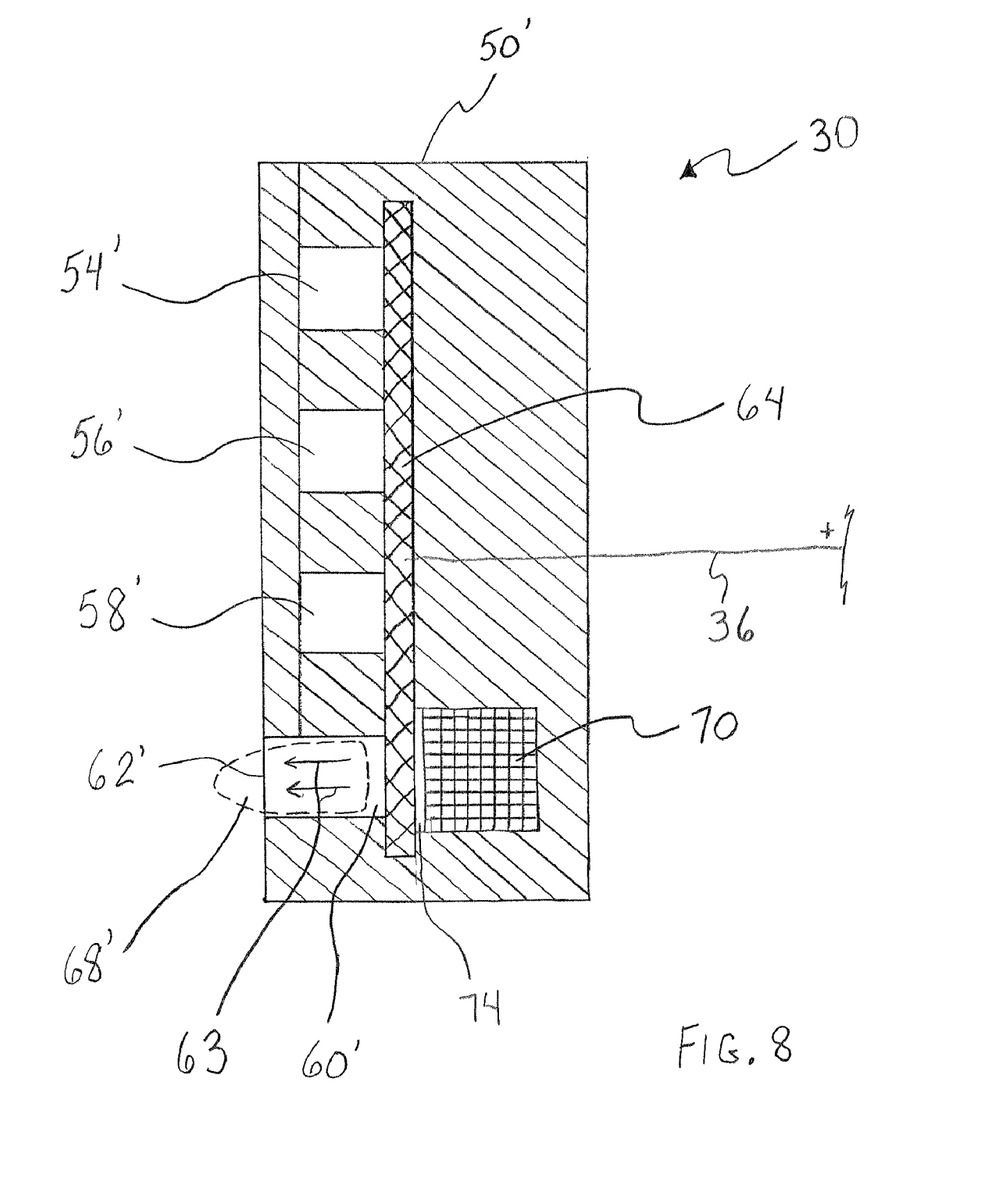
FIG. 8 is a schematic cross sectional view of the gas manifold assembly of FIG. 4 taken along the line VIII-VIII in accordance with a further embodiment of the invention.
Figure 9:
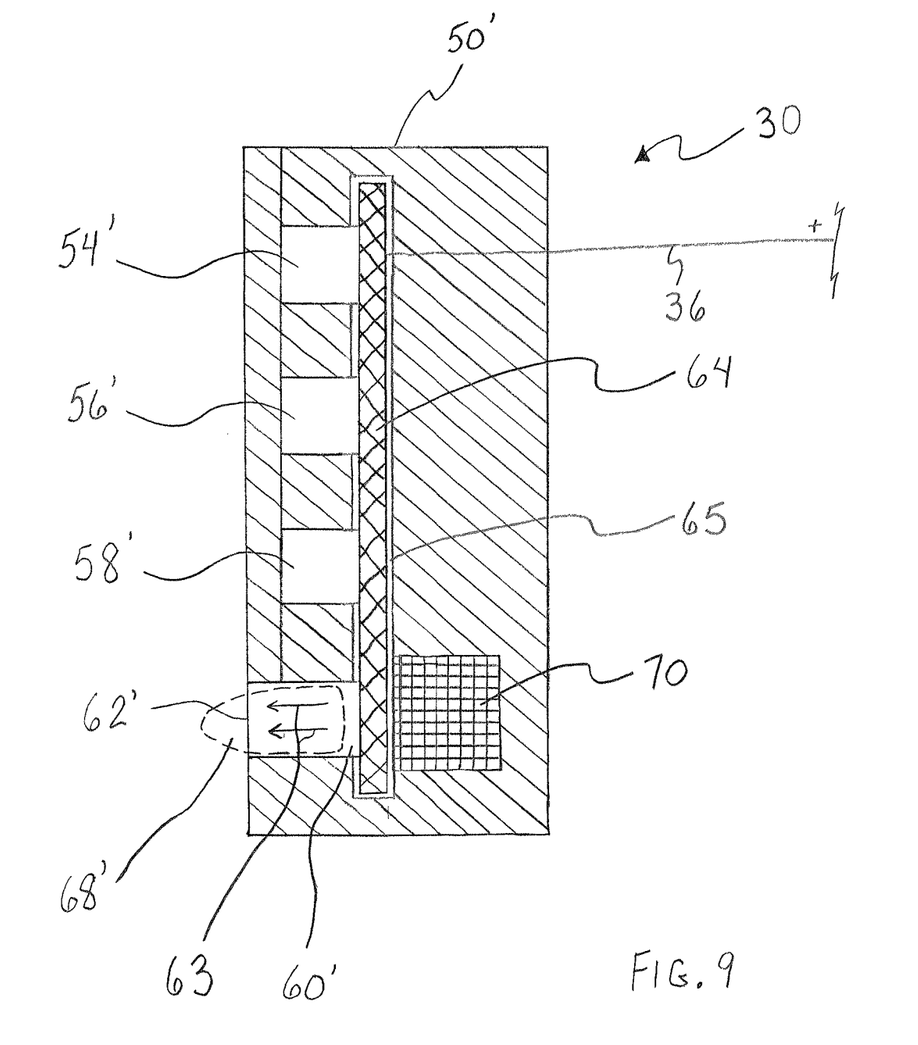
FIG. 9 is a schematic cross sectional view of the gas manifold assembly of FIG. 4 taken along the line IX-IX in accordance with another further embodiment of the invention.

In certain embodiments, the gas manifold 30 of FIG. 1 contains a magnet. With respect to the configurations of the gas manifold 30 described above in FIGS. 2-3 and FIGS. 4-6, corresponding configurations of such manifolds 50 and 50' including a magnet 70 are exemplarily shown in FIGS. 7-9. Specifically, FIG. 7 shows a cross sectional view of the gas manifold 50 that contains the magnet 70, while FIGS. 8 and 9 illustrate cross-sectional side views of the gas manifold 50' that both contains both the conductive mass 64 and the magnet 70. As should be appreciated, the manifold 50 of FIG. 7 and the manifold 50' of FIGS. 8 and 9 illustrate particular binary manifold configurations; however, as already described, the invention is not so limited. In addition, it should be appreciated that the manifolds 50 and 50' in FIGS. 7 and 8-9, while depicted as binary manifold, would not limit the invention to such.

As shown in FIG. 7, the magnet 70 is positioned behind outlets 62 (optionally behind all outlets 62) of the manifold 50. The magnet 70 can include one or more magnets, and is generally separated from any electrically energized part of the manifold 50. This separation of the magnet 70 and the manifold 50 can be achieved with an insulating body 72 being placed between the manifold 50 and the magnet 70. Alternatively, the magnet 70 may be separated from the manifold 50 by providing a gap between the magnet 70 and the manifold 50.

As shown in FIGS. 8 and 9, the magnet 70 is positioned behind the conductive mass 64 so that the conductive mass 64 is located between outlets 62' of the manifold 50' and the magnet 70. The magnet 70 can include one or more magnets. In FIG. 8, the magnet 70 is generally separated from any electrically energized part of the conductive mass 64 and the manifold 50' (if the manifold 50' is energized). Electrical separation of the magnet 70 from the conductive mass 64 can be achieved with an insulating body (shown in FIG. 8 as 74 and shown in FIG. 9 as the dielectric coating 65) being placed between the magnet 70 and the conductive mass 64. Alternatively, the magnet 70 may be separated from the conductive mass 64 by providing a gap between the magnet 70 and the conductive mass 64. Likewise, the magnet 70 and the manifold 50' can be electrically separated if the manifold 50' is energized.

As described above, the gas manifold 50 of FIG. 7 or the gas manifold 50' of FIGS. 8 or 9 can be implemented as the gas manifolds 30 of the system 10 of FIG. 1. In using the system 10, the magnet 70 provides a magnetic field that converges on the inner body of the gas manifold 50 or on the conductive mass 64 within the gas manifold 50'. The converging magnetic field assists in guiding the electrons in the chamber 12 toward the inner surfaces of the gas manifold 50 or the conductive mass 64 and, yet more importantly, increases the path length of the electrons. In particular, the path length of the electrons is translated from a linear motion to a spiraling motion. Such increased electron path length further increases the probability of collisions with the gas 63 flowing out of the manifold outlets 62 or 62', thereby increasing the quantity of such collisions. Additionally, changing the electrons' motion from linear to spiral, due to the convergent field, produces a magnetic mirror effect. This impedes the electrons from reaching the inner surfaces of the manifold 50 or the conductive mass 64, which further increases the resident time in the immediate vicinity of the manifold 50 or the conductive mass 64, hence further increasing the probability for ionizing and/or dissociating collisions. Moreover, the magnetic mirror impedance necessitates a higher voltage drop between the plasma and the inner surfaces of the manifold 50 or the conductive mass 64 in order to achieve adequate electron conductance across the anode sheath. Hence, a greater electric field is produced for accelerating the ions in a preferred direction. As described above, an increased quantity of collisions results in more intense plasma plumes 68' created at the outlets 62 or 62' (in comparison to systems without the magnets 70) and enhances the paths of conduction for the electrons, so as to enable a better maintenance of stable plasma in the deposition chamber 12. In addition, the increased quantity of collisions results in increased ionization of the gas 63 flowing through the plasma plumes 68', which results in an enhanced deposition output from the system 10.

While the invention preferably utilizes reactive sputtering gas (optionally in combination with inert gas), this is by no means required. For example, the manifold can be used in non-reactive sputtering. Moreover, other process parameters are not limited. For example, DC (i.e., direct current) or AC (i.e., alternating current) sputtering can be performed. While DC magnetron sputtering is advantageous in terms of cost and productivity, especially for coating large-area substrates, RF sputtering techniques are also suitable.

While there have been described what are believed to be preferred embodiments of the present invention, those skilled in the art will recognize that other and further changes and modifications can be made without departing from the spirit of the invention, and all such changes and modifications should be understood to fall within the scope of the invention.

What is claimed is:

1. A sputtering apparatus, comprising:
   a vacuum chamber for containing a substrate to be coated via a sputtering process;
   a target adapted to be energized as a cathode and having a surface to be sputtered for coating the substrate;
   a gas supply;
   a binary gas manifold having an inlet and a plurality of outlets, the inlet operatively coupled to the gas supply so as to receive gas at a selected gas pressure and each of the outlets located within the vacuum chamber, the inlet in fluid communication with each of the plurality of outlets via paths of at least substantially equal conductance; and
   a conductive mass located within the gas manifold and electrically isolated from the gas manifold, wherein the conductive mass is adapted to be energized as an anode when the sputtering apparatus is in use.

2. The apparatus of claim 1, wherein the inlet of the gas manifold is evenly split into two of the paths, wherein each of the paths is continually and evenly split into further of the paths until a quantity of the paths equals the plurality of outlets of the gas manifold.

3. The apparatus of claim 1, wherein the conductive mass is a single plate located adjacent to the outlets of the gas manifold.

4. The apparatus of claim 1, wherein the conductive mass has a surface adjacent to an inner surface of the gas manifold.

5. The apparatus of claim 4, wherein the conductive mass is partially embedded within the gas manifold.

6. The apparatus of claim 4, wherein the gas manifold is made of a dielectric material.

7. The apparatus of claim 4, wherein portions of the gas manifold including the inner surface are made of a dielectric material.

8. The apparatus of claim 4, wherein the surface of the conductive mass adjacent to the inner surface of the gas manifold has a permanent coating of dielectric material thereon.

9. The apparatus of claim 4, wherein the inner surface of the gas manifold has a permanent coating of dielectric material thereon.

10. The apparatus of claim 1, further comprising a magnet at least partially encased within the gas manifold, wherein the magnet is located between the conductive mass and a portion of the gas manifold.

11. The apparatus of claim 10, wherein the magnet is electrically isolated from one or more of the conductive mass and the gas manifold.

12. A method of using the apparatus as recited in claim 1 to deposit a film on the substrate by reactively sputtering the target when the substrate is located in the vacuum chamber.

13. The method of claim 12, further comprising the step of electrically connecting the target and the conductive mass to a direct current power source.

14. The method of claim 12, further comprising the step of at least partially encasing a magnet within the gas manifold, wherein the magnet is electrically separated from one or more of the conductive mass and the gas manifold.

15. The method of claim 14, wherein the magnet is positioned behind each of the plurality of outlets, and wherein the magnet is adapted to increase path length of electrons proximate to the conductive mass, thereby increasing incidence rate of collisions between the electrons and gas flowing through the outlets of the gas manifold.

16. An anode arrangement for a sputtering apparatus, comprising:
   a binary gas manifold having an inlet and a plurality of outlets, the inlet operatively coupled to a gas supply so as to receive gas at a selected gas pressure and each of the outlets located within a vacuum chamber, the inlet in fluid communication with each of the plurality of outlets via paths of at least substantially equal conductance; and
   a conductive mass located within the gas manifold and electrically isolated from the gas manifold, wherein the conductive mass is adapted to be energized as an anode when the sputtering apparatus is in use.

17. The anode arrangement of claim 16, wherein the inlet of the gas manifold is evenly split into two of the paths, wherein each of the paths is continually and evenly split into further of the paths until a quantity of the paths equals the plurality of outlets of the gas manifold.

18. The anode arrangement of claim 16, wherein the conductive mass is a single plate located adjacent to the outlets of the gas manifold.

19. The anode arrangement of claim 16, wherein the conductive mass has a surface adjacent to an inner surface of the gas manifold.

20. The anode arrangement of claim 19, wherein the conductive mass is partially embedded within the gas manifold.

21. The anode arrangement of claim 19, wherein the gas manifold is made of a dielectric material.

22. The anode arrangement of claim 19, wherein portions of the gas manifold including the inner surface are made of a dielectric material.

23. The anode arrangement of claim 19, wherein the surface of the conductive mass adjacent to the inner surface of the gas manifold has a permanent coating of dielectric material thereon.

24. The anode arrangement of claim 19, wherein the inner surface of the gas manifold has a permanent coating of dielectric material thereon.

25. The anode arrangement of claim 16, further comprising a magnet at least partially encased within the gas manifold, wherein the magnet is located between the conductive mass and a portion of the gas manifold.

26. The anode arrangement of claim 25, wherein the magnet is electrically isolated from one or more of the conductive mass and the gas manifold.

27. A sputtering apparatus, comprising:
   a vacuum chamber for containing a substrate to be coated via a sputtering process;
   a target adapted to be energized as a cathode and having a surface to be sputtered for coating the substrate;
   a gas supply;
   a gas manifold having an inlet and a plurality of outlets, the inlet operatively coupled to the gas supply so as to receive gas at a selected pressure and each of the outlets located within the vacuum chamber;
   a conductive mass located adjacent to an inner surface of the gas manifold and electrically isolated from the gas manifold, wherein the conductive mass is adapted to be energized as an anode when the sputtering apparatus is in use; and
   a magnet at least partially encased within the gas manifold, the magnet located between the conductive mass and a portion of the gas manifold.

28. The apparatus of claim 27, wherein the gas manifold is a binary manifold, wherein the inlet in is fluid communication via paths of equal conductance with each of the plurality of outlets.

29. The apparatus of claim 28, wherein the inlet of the gas manifold is evenly split into two of the paths, wherein each of the paths is continually and evenly split into further of the paths until a quantity of the paths equals the plurality of outlets of the gas manifold.

30. The apparatus of claim 27, wherein the conductive mass is a single plate located adjacent to the outlets of the gas manifold.

31. The apparatus of claim 27, wherein the magnet is electrically isolated from one or more of the conductive mass and the gas manifold.

32. A sputtering apparatus, comprising:
a vacuum chamber for containing a substrate to be coated via a sputtering process;
a target adapted to be energized as a cathode and having a surface to be sputtered for coating the substrate;
a gas supply; and
a binary gas manifold having an inlet and a plurality of outlets, the inlet operatively coupled to the gas supply so as to receive gas at a selected gas pressure and each of the outlets located within the vacuum chamber, the inlet in fluid communication with each of the plurality of outlets via paths of at least substantially equal conductance, the gas manifold adapted to be energized as an anode when the sputtering apparatus is in use, the gas manifold having outer surfaces that have a permanent coating of dielectric material thereon.

33. The apparatus of claim 32, wherein the inlet of the gas manifold is evenly split into two of the paths, wherein each of the paths is continually and evenly split into further of the paths until a quantity of the paths equals the plurality of outlets of the gas manifold.

34. The apparatus of claim 32, further comprising a magnet at least partially encased within the gas manifold, and wherein the magnet is located adjacent to the outlets of the gas manifold.

35. The apparatus of claim 32, wherein the magnet is electrically isolated from the gas manifold.

36. A method of using the apparatus as recited in claim 32 to deposit a film on the substrate by reactively sputtering the target when the substrate is located in the vacuum chamber.

37. The method of claim 36, further comprising the step of electrically connecting the target and the gas manifold to a direct current power source.

38. The method of claim 36, further comprising the step of at least partially encasing a magnet within the gas manifold, wherein the magnet is electrically separated from the gas manifold.

39. The method of claim 38, wherein the magnet is located adjacent to the outlets of the gas manifold, and wherein the magnet is adapted to increase path length of electrons proximate to the outlets, thereby increasing incidence rate of collisions between the electrons and gas flowing through the outlets.

40. An anode arrangement for sputtering apparatus, comprising:
a binary gas manifold having an inlet and a plurality of outlets, the inlet operatively coupled to a gas supply so as to receive gas at a selected gas pressure and each of the outlets located within a vacuum chamber, the inlet in fluid communication with each of the plurality of outlets via paths of at least substantially equal conductance, the gas manifold adapted to be energized as an anode when the sputtering apparatus is in use, the gas manifold having outer surfaces that have a permanent coating of dielectric material thereon.

41. The anode arrangement of claim 40, wherein the inlet of the gas manifold is evenly split into two of the paths, wherein each of the paths is continually and evenly split into further of the paths until a quantity of the paths equals the plurality of outlets of the gas manifold.

42. The anode arrangement of claim 40, further comprising a magnet at least partially encased within the gas manifold, and wherein the magnet is located adjacent to the outlets of the gas manifold.

43. The anode arrangement of claim 42, wherein the magnet is electrically isolated from the gas manifold.

44. A sputtering apparatus, comprising:
a vacuum chamber for containing a substrate to be coated via a sputtering process;
a target adapted to be energized as a cathode and having a surface to be sputtered for coating the substrate;
a gas supply;
a gas manifold having an inlet and a plurality of outlets, the inlet operatively coupled to the gas supply so as to receive gas at a selected gas pressure and each of the outlets located within the vacuum chamber, the gas manifold adapted to be energized as an anode when the sputtering apparatus is in use, the gas manifold having outer surfaces that have a permanent coating of dielectric material thereon; and
a magnet at least partially encased within the gas manifold, the magnet located adjacent to the outlets of the gas manifold.

45. The apparatus of claim 44, wherein the gas manifold is a binary manifold, wherein the inlet in is fluid communication via paths of equal conductance with each of the plurality of outlets.

46. The apparatus of claim 45, wherein the inlet of the gas manifold is evenly split into two of the paths, wherein each of the paths is continually and evenly split into further of the paths until a quantity of the paths equals the plurality of outlets of the gas manifold.

47. The apparatus of claim 44, wherein the magnet is electrically isolated from the gas manifold.

48. The apparatus of claim 27, wherein the conductive mass is embedded entirely other than at surface facing the outlets.

49. The apparatus of 32, wherein the dielectric coating maintains inner surfaces of the gas manifold as only paths for electrons to return to power source when the sputtering apparatus is in use.

50. The anode arrangement of claim 40, wherein the dielectric material maintains inner surfaces of the gas manifold as only paths for electrons to return to power source when the sputtering apparatus is in use.

51. The apparatus of 44, wherein the dielectric material maintains inner surfaces of the gas manifold as only paths for electrons to return to power source when the sputtering apparatus is in use.

* * * * *